United States Patent
Nasman

(10) Patent No.: US 12,447,513 B2
(45) Date of Patent: Oct. 21, 2025

(54) GAS CABINET WITH REDUCED GAS EMISSIONS AND EXHAUST FLOW RATE

(71) Applicant: Tokyo Electron Limited, Tokyo (JP)

(72) Inventor: Ronald Nasman, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 209 days.

(21) Appl. No.: 18/374,406

(22) Filed: Sep. 28, 2023

(65) Prior Publication Data

US 2025/0108418 A1    Apr. 3, 2025

(51) Int. Cl.
*B08B 15/02*    (2006.01)
*H01L 21/67*    (2006.01)

(52) U.S. Cl.
CPC ...... *B08B 15/023* (2013.01); *H01L 21/67017* (2013.01); *B08B 2215/003* (2013.01)

(58) Field of Classification Search
None
See application file for complete search history.

(56) References Cited

U.S. PATENT DOCUMENTS

| | | | | |
|---|---|---|---|---|
| 4,436,022 A | * | 3/1984 | Zboralski | B08B 15/023 454/59 |
| 4,625,627 A | | 12/1986 | Livanos et al. | |
| 5,126,117 A | * | 6/1992 | Schumacher | B01D 53/46 55/482 |
| 5,282,367 A | * | 2/1994 | Moore | A47F 3/0443 454/193 |
| 5,360,372 A | * | 11/1994 | Newman | A62B 3/00 454/238 |
| 5,665,128 A | * | 9/1997 | Peters | B08B 15/023 55/385.2 |
| 5,725,622 A | * | 3/1998 | Whitson | H05K 7/1412 55/502 |
| 5,964,659 A | | 10/1999 | Hertzler et al. | |
| 6,105,606 A | | 8/2000 | Jackson | |

(Continued)

FOREIGN PATENT DOCUMENTS

| CN | 209279280 | 8/2019 |
|---|---|---|
| CN | 115274504 | 11/2022 |

OTHER PUBLICATIONS

The International Search Report And The Written Opinion; PCT/US2024/038304; Oct. 29, 2024; 11 pgs.

*Primary Examiner* — Joseph A Dillon, Jr.
(74) *Attorney, Agent, or Firm* — Egan, Enders & Huston LLP.

(57) ABSTRACT

Embodiments of improved gas cabinets and associated methods are provided herein to reduce diffusion of process gas outside of a gas cabinet. In the disclosed embodiments, a gas cabinet is provided with: (a) an exhausted enclosure for housing at least one gas vessel (containing a process gas) and associated gas distribution components within an interior of the enclosure, (b) an air intake vent for drawing ambient air from outside of the exhausted enclosure into an interior of the exhausted enclosure, and (c) an air plenum that is mounted within the interior of the exhausted enclosure directly behind the air intake vent for increasing the airflow path length from the outside of the exhausted enclosure into the interior of the enclosure. By increasing the airflow path length, the air plenum provided within the gas cabinet reduces the diffusion of process gas outside of the exhausted enclosure.

17 Claims, 8 Drawing Sheets

(56) References Cited

U.S. PATENT DOCUMENTS

| | | | | |
|---|---|---|---|---|
| 6,163,454 | A | * | 12/2000 | Strickler ............ H05K 9/0041 |
| | | | | 361/818 |
| 6,471,750 | B1 | | 10/2002 | Olander |
| 8,456,806 | B2 | * | 6/2013 | Cosley ............... H05K 7/14325 |
| | | | | 307/64 |
| 8,851,106 | B2 | | 10/2014 | Okabe |
| 9,326,426 | B2 | * | 4/2016 | James ................ H05K 7/20572 |
| 9,383,064 | B2 | | 7/2016 | Olander et al. |
| 10,919,225 | B2 | * | 2/2021 | Chanclon Fernandez .................. B29C 64/259 |
| 11,097,845 | B2 | * | 8/2021 | Burd ...................... B64D 13/06 |
| 2005/0087072 | A1 | * | 4/2005 | Wodjenski ......... B01D 53/0446 |
| | | | | 96/111 |
| 2008/0101998 | A1 | * | 5/2008 | Armstrong ................ A61L 9/20 |
| | | | | 422/121 |
| 2011/0303100 | A1 | | 12/2011 | Agnello et al. |
| 2012/0176732 | A1 | | 7/2012 | Cosley et al. |
| 2013/0337737 | A1 | * | 12/2013 | DeVarney ............. F17C 13/084 |
| | | | | 454/347 |
| 2016/0305682 | A1 | | 10/2016 | Olander et al. |

\* cited by examiner

GAS CABINET WITH REDUCED GAS EMISSIONS AND EXHAUST FLOW RATE

TECHNICAL FIELD

The present disclosure relates to gas containment systems, and in particular embodiments, to a gas cabinet (or exhausted enclosure) for housing one or more gas vessels and preventing gas emissions from escaping the gas cabinet.

BACKGROUND

A wide variety of process gases are used to manufacture semiconductor devices. The process gases used in semiconductor manufacturing are generally packaged in gas cylinders, which are transported to the semiconductor fabrication (FAB) site where the gaseous material is withdrawn and distributed to processing equipment through gas supply lines. Because many of the process gases used in semiconductor manufacturing are highly toxic, the gas cylinders provided to the semiconductor fabrication site are often housed within gas cabinets (or exhausted enclosures) to protect the ambient environment and personnel from toxic gas that may leak from the gas cylinders.

Gas cabinets are sheet metal enclosures designed for containing gas cylinder(s) within the semiconductor manufacturing facility. Gas cabinets provide a secure, ventilated housing to safely contain the gas cylinders and associated gas distribution components (e.g., gas piping, control valves, sensors, etc.), which is used to selectively withdraw the gaseous material from the gas cylinders and distribute the gaseous material to the processing equipment. The gas cabinet is designed to protect the gas cylinders and the associated gas distribution components from accidental damage and provide controlled access to the gas cylinders. Although not totally sealed, gas cabinets are generally designed to resist leakage of gases into the ambient environment.

FIG. 7 illustrates one example of a conventional gas cabinet 10 designed to contain one or more gas cylinders. The gas cabinet 10 shown in FIG. 7 is a sheet metal enclosure in the form of an elongated vertically oriented box 20 having an access door 30, a control panel 40 and an exhaust port 50. Although not shown in FIG. 7, the interior of the gas cabinet 10 may be generally configured to house one or more gas cylinders, gas control valves and piping for selectively withdrawing the process gas from the gas cylinder(s). The access door 30 provides access to the interior of the gas cabinet 10, enabling the gas cylinder(s) to be placed inside and secured within the gas cabinet 10. In the conventional gas cabinet 10 shown in FIG. 7, the access door 30 includes a viewing port 32, a door latch and lock mechanism 34 and an air intake vent 36, which is located near the bottom of the access door 30 for drawing ambient air into the interior of the gas cabinet 10.

Conventional gas cabinets are ventilated with air inlet vents and exhaust ducting, so that ambient air can be continuously drawn through the gas cabinet and exhausted into the exhaust ventilation system of the FAB. The ambient air drawn into the gas cabinet sweeps any process gas leaking from the gas cylinder(s) or gas distribution components into the exhaust ventilation system. In the conventional gas cabinet 10 shown in FIG. 7, for example, ambient air is drawn into the gas cabinet 10 through the air intake vent 36 located near the bottom of the cabinet, swept through the interior of the gas cabinet 10 and exhausted through the exhaust port 50 at the top of the cabinet.

Although airflow is provided through the gas cabinet 10, this arrangement can result in channeling, dead areas and unswept corners where gas leaking from the gas cylinder(s) or piping can accumulate.

The conventional method of compensating for this problem has been to connect the exhaust port 50 of the gas cabinet 10 to a high capacity exhaust ventilation system, which is expensive to install and maintain. High capacity exhaust ventilation systems draw air from inside the gas cabinet 10 at a relatively high exhaust flow rate (e.g., several hundred cubic feet per minute (cfm) for a single cylinder cabinet) to create a negative pressure inside the box 20. The openings 38 provided within the air intake vent 36 allow ambient air to flow into the box 20 to create the airflow necessary to sweep any gas vapors released inside the box 20 up to the exhaust port 50 where it can be exhausted into the exhaust ventilation system. The openings 38 provided within the air intake vent 36 are typically limited in number and size, so as to increase the air flow velocity into the openings 38 and limit the amount of internal gas vapors that diffuse back out of the air intake vent 36. However, because the openings 38 provided within the air intake vent 36 are only as deep as the sheet metal thickness used to form the access door 30 (or the box 20 if the air intake vent 36 were, instead, provided on a side of the box 20), there is still a possibility of gas diffusion outside of the box 20.

Gas cabinets are commonly tested with a tracer gas (for example, a perfluorocarbon tracer gas, such as perfluorodimethylcyclobutane, PDCB) to verify compliance with health and safety standards. In one such test, a tracer gas is provided within the gas cabinet and the chemical concentration of the tracer gas external to the gas cabinet is measured and compared against acceptable exposure limits. The measurement results obtained from the test are used to determine the exhaust flow rate required to ensure that the concentration (or release rate) of the tracer gas released outside of the gas cabinet remains below the acceptable exposure limits. Unfortunately, conventional gas cabinets (such as the gas cabinet 10 shown in FIG. 7) require relatively high exhaust flow rates (e.g., above 100 cfm) to meet the acceptable exposure limits. Because of the amount of energy required to run the blowers at such high exhaust flow rates, the cost in energy consumption is still very high.

Accordingly, a need remains for a gas cabinet with reduced gas emissions and exhaust flow rates.

SUMMARY

The present disclosure provides various embodiments of improved gas cabinets and associated methods to reduce diffusion of process gas outside of a gas cabinet. In the disclosed embodiments, a gas cabinet is provided with: (a) an exhausted enclosure for housing at least one gas vessel and associated gas distribution components within an interior of the enclosure, where the at least one gas vessel contains a process gas used in semiconductor manufacturing, (b) an air intake vent for drawing ambient air from outside of the exhausted enclosure into the interior of the exhausted enclosure, and (c) an air plenum that is mounted within the interior of the exhausted enclosure directly behind the air intake vent for increasing the airflow path length from the outside of the exhausted enclosure into the interior of the enclosure. By increasing the airflow path length from the outside of the exhausted enclosure into the interior of the enclosure, the air plenum provided within the gas cabinet reduces (or substantially prevents) the diffusion of process gas outside of the exhausted enclosure.

The embodiments disclosed herein overcome problems associated with conventional gas cabinets by providing an air plenum directly behind the air intake vent. The air plenum comprises a planar surface having a plurality of openings, which are vertically offset from a plurality of openings provided within the air intake vent. When an air plenum is included within the gas cabinet, ambient air from outside the exhausted enclosure is: (a) drawn into the plurality of openings provided within the air intake vent, (b) redirected upward through a gap formed between a rear side of the air intake vent and the planar surface of the air plenum, and (c) drawn through the plurality of openings provided within the air plenum into the interior of the exhausted enclosure. By redirecting the ambient air through the gap, the air plenum increases the airflow path length from outside of the exhausted enclosure into the interior of the exhausted enclosure. The increased airflow path length provided by the air plenum reduces (or substantially prevents) the diffusion of process gas outside of the exhausted enclosure, and in some cases, enables the exhaust flow rate required to meet acceptable exposure limits to be reduced. The lower exhaust flow rate reduces loading on the exhaust ventilation system and reduces the amount of energy consumed by the blowers to create the lower exhaust flow rate.

A gas cabinet is provided herein with reduced gas emissions and/or exhaust flow rates. According to one embodiment of the present disclosure, the gas cabinet may generally include an enclosure, which is configured to contain at least one gas vessel and associated gas distribution components within an interior of the enclosure, and an exhaust port arranged near a top of the enclosure. In some embodiments, the at least one gas vessel may contain a process gas used in semiconductor manufacturing. An exhaust ventilation system may be coupled to the exhaust port to create a negative pressure within the interior of the enclosure.

The gas cabinet may further include an air intake vent having a first plurality of openings and an air plenum mounted within the interior of the enclosure directly behind the air intake vent. The negative pressure created by the exhaust ventilation system may draw ambient air from outside of the enclosure into the interior of the enclosure through the first plurality of openings provided within the air intake vent to create an airflow through the interior of the enclosure that sweeps any process gas, which leaks from the at least one gas vessel or the associated gas distribution components, up to the exhaust port where it is exhausted into the exhaust ventilation system at an exhaust flow rate. The air plenum mounted behind the air intake vent provides a longer airflow path from the outside of the enclosure into the interior of the enclosure, which reduces a diffusion of process gas outside of the enclosure and/or enables the exhaust flow rate of the exhaust ventilation system to be reduced.

In some embodiments, the air plenum may include a planar surface having a second plurality of openings formed therein. The second plurality of openings provided within the air plenum may be vertically offset from the first plurality of openings provided within the air intake vent to provide the longer airflow path from the outside of the enclosure into the interior of the enclosure. The longer airflow path provided by the air plenum may be fixed and not adjustable In some embodiments, the second plurality of openings provided within the air plenum may be vertically offset from the first plurality of openings provided within the air intake vent by an amount that ensures openings within the second plurality of openings do not horizontally align with openings within the first plurality of openings. For example, the first plurality of openings and the second plurality of openings may each be arranged in a plurality of rows and a plurality of columns, wherein a spacing exists between each of the plurality of rows. In some embodiments, the second plurality of openings may be vertically offset from the first plurality of openings by an amount, which is less than the spacing between each of the plurality of rows.

In some embodiments, a number and/or size of openings within the second plurality of openings may be substantially equal to a number and/or size of openings within the first plurality of openings. In other embodiments, a number and/or size of openings within the second plurality of openings may be different from a number and/or size of openings within the first plurality of openings.

When the air plenum is included within the gas cabinet, the ambient air from outside of the enclosure is: (a) drawn into the first plurality of openings provided within the air intake vent, (b) redirected upward through a gap formed between a rear side of the air intake vent and the planar surface of the air plenum, and (c) drawn through the second plurality of openings provided within the air plenum into the interior of the enclosure. In some embodiments, a width of the gap may be less than or equal to a length or a width of the openings within the first plurality of openings. For example, the width of the gap may less than or equal to one inch, ½ inch or ¼ inch. In one example embodiment, the width of the gap may be substantially equal to ¼ inch.

In some embodiments, the gas cabinet may include an additional air intake vent having a third plurality of openings, and an additional air plenum mounted within the interior of the enclosure directly behind the additional air intake vent. The additional air plenum may include a planar surface having a fourth plurality of openings formed therein. Similar to the air intake vent and air plenum described above, the fourth plurality of openings provided within the additional air plenum may be vertically offset from the third plurality of openings provided within the additional air intake vent to provide a longer airflow path from the outside of the enclosure into the interior of the enclosure. When the additional air intake vent and the additional air plenum are provided within the gas cabinet, the negative pressure created by the exhaust ventilation system may draw the ambient air from outside of the enclosure through the third plurality of openings provided within the additional air intake vent. The ambient air drawn through the third plurality of openings may then be redirected through a gap formed between a rear side of the additional air intake vent and the planar surface of the additional air plenum before it is drawn through the fourth plurality of openings provided within the additional air plenum into the interior of the enclosure.

In some embodiments, the enclosure may include a plurality of sides forming an elongated box. For example, the plurality of sides may include a front side, a back side, a left side, a right side, a top side and a bottom side. In some embodiments, the gas cabinet may include an access door, which is coupled to the front side of the enclosure to provide access to the interior of the enclosure. In some embodiments, the air intake vent may be provided within the access door, and the air plenum may be mounted to a rear surface of the access door directly behind the air intake vent.

In some embodiments, the air intake vent may be provided within a lower portion of the access door and the air plenum may be mounted to the rear surface of the lower portion of the access door directly behind the air intake vent. In some embodiments, the additional air intake vent may be provided within an upper portion of the access door and the additional air plenum may be mounted to the rear surface of the upper portion of the access door directly behind the additional air intake vent.

According to another embodiment of the present disclosure, the gas cabinet may generally include an enclosure configured to contain at least one gas vessel and associated gas distribution components within an interior of the enclosure, and an exhaust port arranged near a top of the enclosure. In some embodiments, the at least one gas vessel may contain a process gas used in semiconductor manufacturing. An exhaust ventilation system may be coupled to the exhaust port to create a negative pressure within the interior of the enclosure. The negative pressure may draw ambient air from outside of the enclosure into the interior of the enclosure and create an airflow through the interior of the enclosure that sweeps any process gas, which leaks from the at least one gas vessel or the associated gas distribution components, up to the exhaust port where it is exhausted into the exhaust ventilation system.

The gas cabinet may further include an air intake vent arranged on one side of the enclosure, and an air plenum mounted within the interior of the enclosure directly behind the air intake vent. The air intake vent may have a first plurality of openings, and the air plenum may include a planar surface having a second plurality of openings, which are vertically offset from the first plurality of openings provided within the air intake vent. In some embodiments, the gas cabinet may include an access door, which is coupled to a front side of the enclosure to provide access to the interior of the enclosure, and the air intake vent may be provided within the access door. In such embodiments, the air plenum may be mounted to a rear surface of the access door directly behind the air intake vent.

When the air plenum is included within the gas cabinet, the ambient air from outside of the enclosure may be: (a) drawn into the first plurality of openings provided within the air intake vent, (b) redirected upward through a gap formed between a rear side of the air intake vent and the planar surface of the air plenum, and (c) drawn through the second plurality of openings provided within the air plenum into the interior of the enclosure. By redirecting the ambient air through the gap, the air plenum provides a longer airflow path from the outside of the enclosure into the interior of the enclosure, which reduces a diffusion of process gas outside of the enclosure.

According to another embodiment of the present disclosure, a method is provided herein for reducing gas emissions and/or exhaust flow rates associated with a gas cabinet. The method may generally begin by providing a gas cabinet comprising an enclosure, an exhaust port, at least one air intake vent and at least one air plenum. The enclosure may be configured to contain at least one gas vessel and associated gas distribution components within an interior of the enclosure. In some embodiments, the at least one gas vessel may contain a process gas used in semiconductor manufacturing. The exhaust port may be arranged near a top of the enclosure and coupled to an exhaust ventilation system. The at least one air intake vent, which may be arranged on at least one side of the enclosure, may have a first plurality of openings. The at least one air plenum may be mounted within the interior of the enclosure directly behind the at least one air intake vent. The at least one air plenum may include a planar surface having a second plurality of openings, which may be vertically offset from the first plurality of openings provided within the at least one air intake vent.

The method may further include operating the exhaust ventilation system to create a negative pressure within the interior of the enclosure to draw ambient air from outside of the enclosure into the interior of the enclosure and create an airflow through the interior of the enclosure that sweeps any process gas, which leaks from the at least one gas vessel or the associated gas distribution components, up to the exhaust port where it is exhausted into the exhaust ventilation system.

When the air plenum is included within the gas cabinet, the ambient air from outside of the enclosure may be: (a) drawn into the first plurality of openings provided within the air intake vent, (b) redirected upward through a gap formed between a rear side of the air intake vent and the planar surface of the air plenum, and (c) drawn through the second plurality of openings provided within the air plenum into the interior of the enclosure. By redirecting the ambient air through the gap, the air plenum provides a longer airflow path from the outside of the enclosure into the interior of the enclosure. As noted above, the longer airflow path reduces a diffusion of process gas outside of the enclosure. In some embodiments, the method may further include reducing an exhaust flow rate of the exhaust ventilation system in response to the diffusion of the process gas outside of the enclosure.

As noted above and described further herein, the present disclosure provides various embodiments of gas cabinets and methods for reducing gas emissions from gas cabinets. Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this Summary section does not specify every embodiment and/or incrementally novel aspect of the present disclosure or claimed inventions. Instead, the Summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

The present disclosure provides various embodiments of improved gas cabinets and associated methods to reduce diffusion of process gas outside of a gas cabinet. In the disclosed embodiments, a gas cabinet is provided with: (a) an exhausted enclosure for housing at least one gas vessel and associated gas distribution components within an interior of the enclosure, where the at least one gas vessel contains a process gas used in semiconductor manufacturing, (b) an air intake vent for drawing ambient air from outside of the exhausted enclosure into the interior of the exhausted enclosure, and (c) an air plenum that is mounted within the interior of the exhausted enclosure directly behind the air intake vent for increasing the airflow path length from the outside of the exhausted enclosure into the interior of the enclosure. By increasing the airflow path length from the outside of the exhausted enclosure into the interior of the enclosure, the air plenum provided within the gas cabinet reduces (or substantially prevents) the diffusion of process gas outside of the exhausted enclosure.

Figure 7:
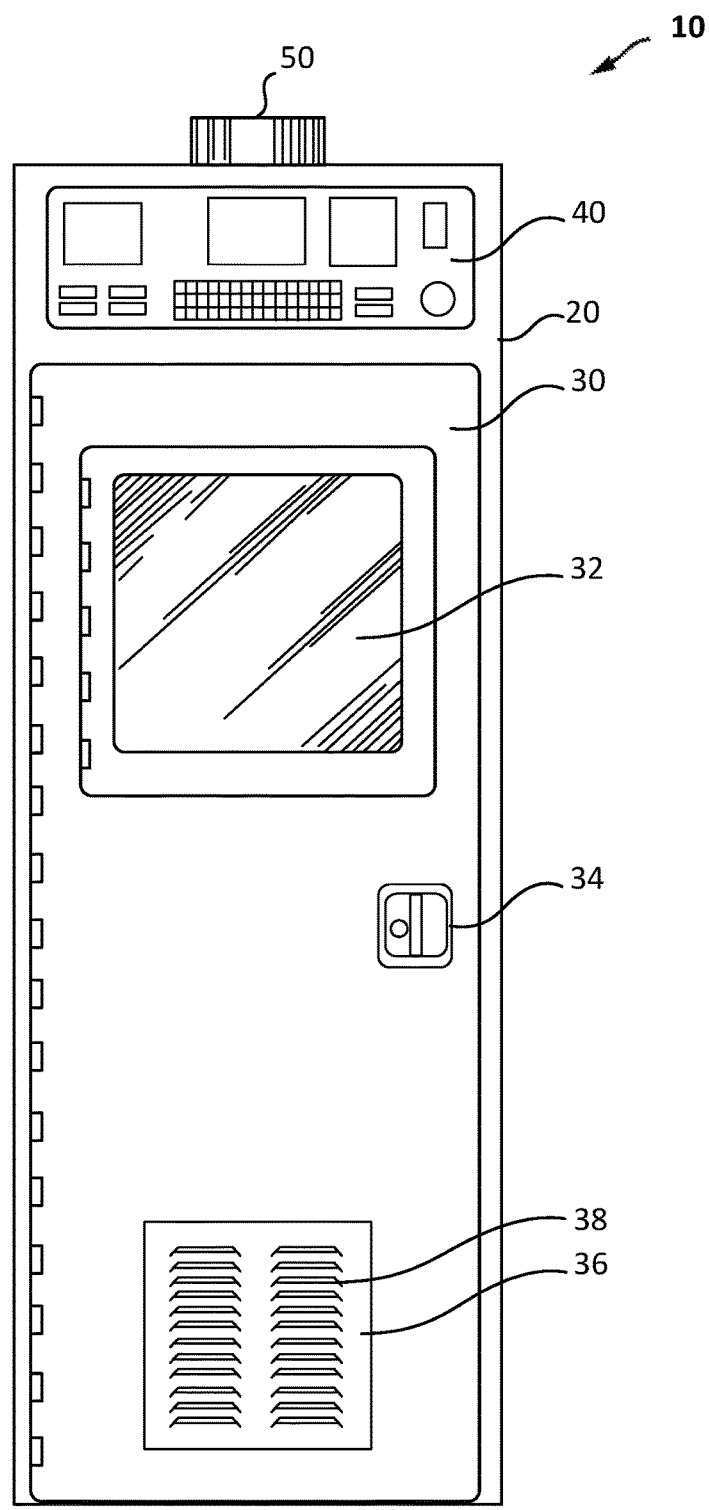
FIG. 7 (Prior Art) illustrates a conventional gas cabinet.

As noted above and shown in FIG. 7, the air intake vent 36 included within the conventional gas cabinet 10 include openings 38, which are only as deep as the sheet metal thickness used to form the access door 30 (or sidewalls of the box 20). When ambient air is drawn into the box 20 through the openings 38 provided within the air intake vent 36, the airflow through the air intake vent 36 creates internal jets that penetrate deep into the box 20. These internal jets create return eddies that push process gases, which may leak from the gas vessel(s) and/or the associated gas distribution components housed within the box 20, toward the rear surface of the air intake vent 36 and the openings 38 formed therein. In some cases, the return eddies may create high concentration, low flow rate zones of leaked process gas near the openings 38 formed within the air intake vent 36.

The high concentration, low flow rate zones of leaked process gas near the openings 38 create the opportunity for the leaked process gas to diffuse out of the box 20 around the perimeter of the openings 38. The airflow profile of the ambient air flowing into the box 20 through the openings 38 formed within the air intake vent 36 is parabolic, with the highest velocity in the middle of the openings 38 and a zero velocity at the perimeter of the openings 38. Because the higher airflow velocities near the middle of the openings 38 cannot overcome the zero velocity at the perimeter of the openings 38, the air intake vent 36 shown in FIG. 7 allows process gases, which may leak from the gas vessel(s) and/or the associated gas distribution components housed within the box 20, to diffuse out of the box 20 around the perimeter of the openings 38.

The embodiments disclosed herein overcome problems associated with conventional gas cabinets (such as, but not limited to, the gas cabinet 10 shown in FIG. 7) by providing an air plenum directly behind the air intake vent. The air plenum comprises a planar surface having a plurality of openings, which are vertically offset from a plurality of openings provided within the air intake vent. By including an air plenum within the gas cabinet disclosed herein, ambient air from outside of the enclosure is: (a) drawn into the plurality of openings provided within the air intake vent, (b) redirected upward through a gap formed between a rear side of the air intake vent and the planar surface of the air plenum, and (c) drawn through the plurality of openings provided within the air plenum into the interior of the exhausted enclosure.

The air plenum provided within the gas cabinet described herein creates a longer airflow path into the exhausted enclosure compared to the airflow path length provided in conventional gas cabinets (which is equal to the sheet metal thickness used to form the access door or sidewalls of the exhausted enclosure). Even though a zero velocity boundary condition may still exist along inner surfaces of the air intake vent and the air plenum, the Brownian motion of the process gas makes it highly improbable that a gas molecule could remain near the inner surfaces in the low velocity flow field for the entire airflow path length. Once the gas molecule enters the higher velocity stream, it will be carried back into the exhausted enclosure by the ambient air drawn into the exhausted enclosure.

Figure 1:
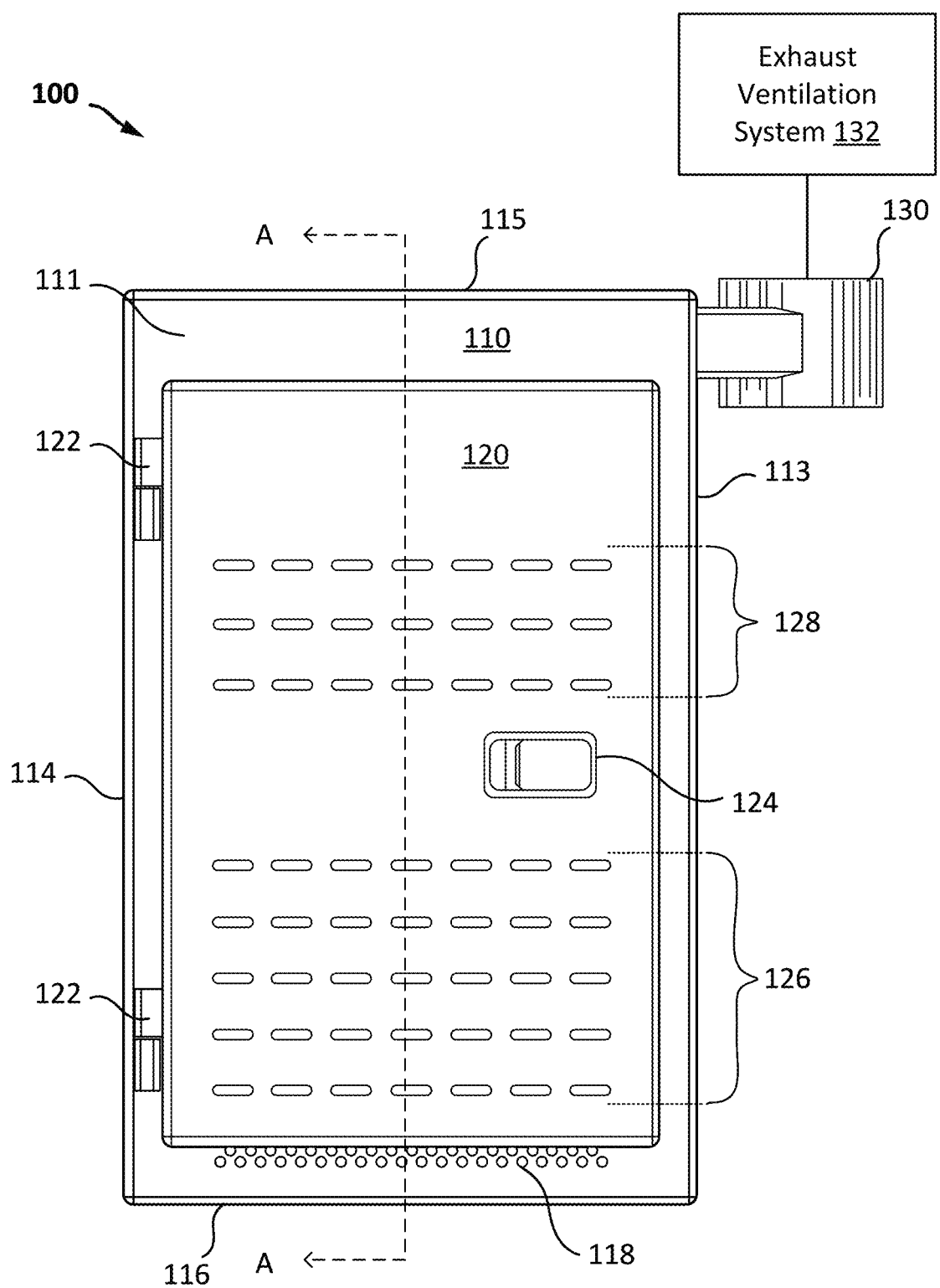
FIG. 1 is a front view of a gas cabinet in accordance with one embodiment of the present disclosure.
Figure 2:
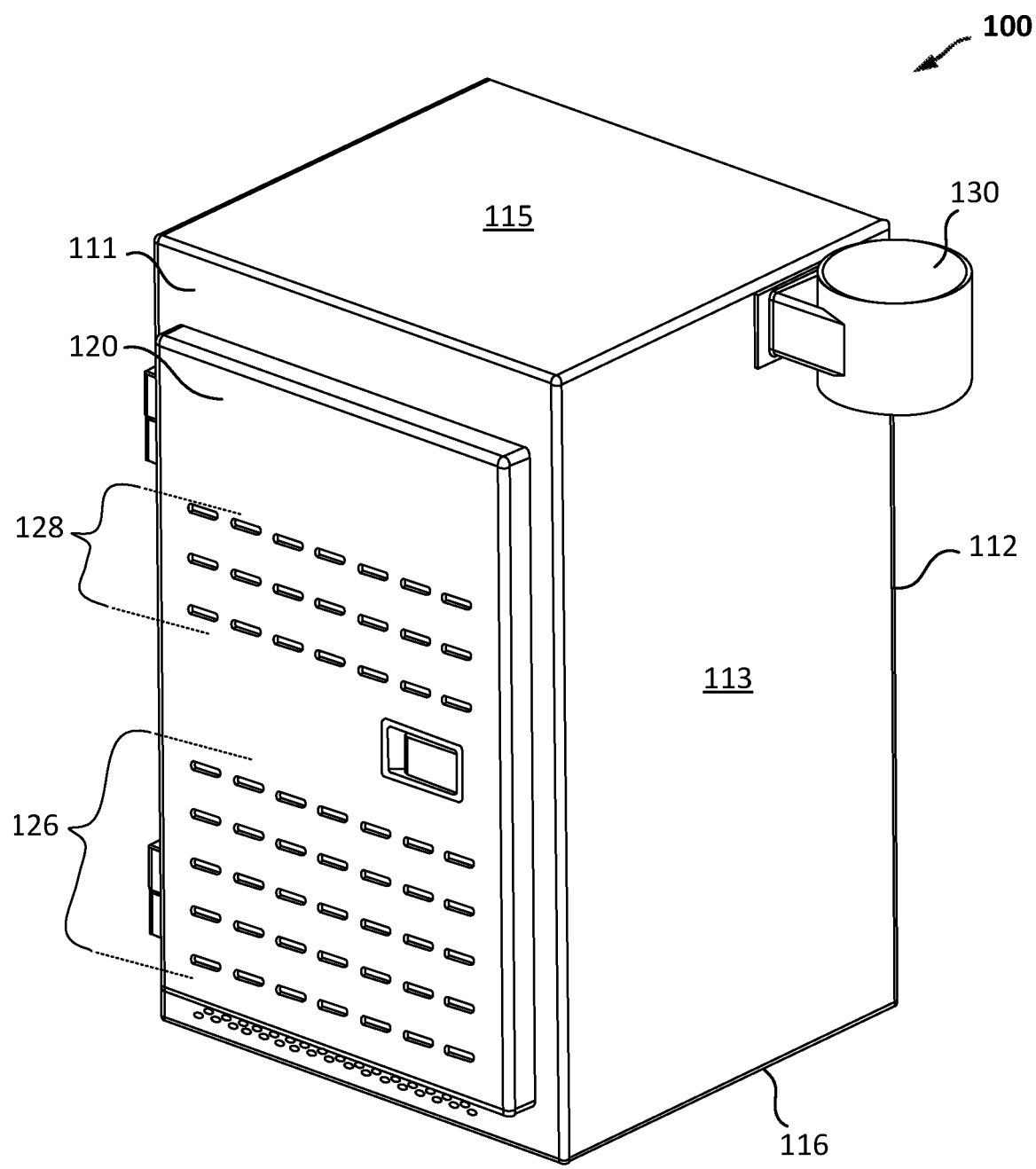
FIG. 2 is a perspective front view of the gas cabinet shown in FIG. 1.
Figure 3:
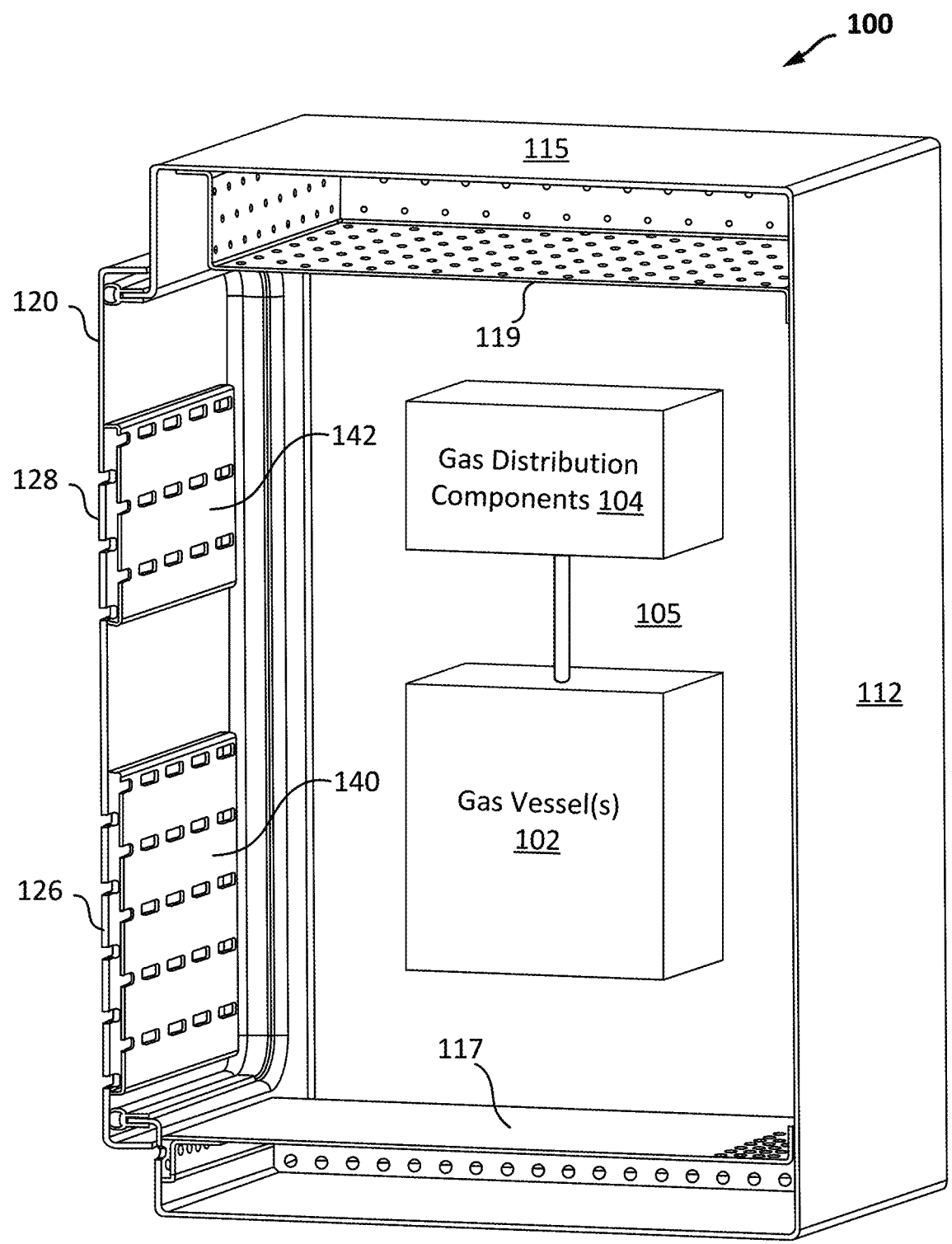
FIG. 3 is a perspective cross-sectional view of the interior of the gas cabinet taken through line A-A of FIG. 1.

FIGS. 1-3 illustrate one embodiment of a gas cabinet 100 in accordance with the present disclosure. The gas cabinet 100 shown in FIGS. 1-3 includes an enclosure 110 (otherwise referred to herein as an exhausted enclosure), which is configured to contain at least one gas vessel 102 and associated gas distribution components 104 (shown in block diagram form in FIG. 3) within an interior 105 of the enclosure 110. The enclosure 110 is implemented as an elongated box having a front side 111, a back side 112, a left side 113, a right side 114, a top side 115 and a bottom side 116. An access door 120 is coupled via hinges 122 to the front side 111 of the enclosure 110 to provide access to the interior 105 of the enclosure 110 and enable the gas vessel(s) 102 to be placed inside and secured within the gas cabinet 100. The access door 120 includes a door latch and lock mechanism 124 opening and closing the access door and securing the access door 120 once closed.

An exhaust port 130 is arranged near the top of the enclosure 110. Although shown on the left side 113 of the enclosure 110 in the embodiment shown in FIGS. 1-3, the exhaust port 130 may be alternatively arranged on the right side 114 or the top side 115 of the enclosure 110 in other embodiments. An exhaust ventilation system 132 shown in block diagram form in FIG. 1 is coupled to the exhaust port 130 to create a negative pressure within the interior 105 of the enclosure 110. The negative pressure draws ambient air from outside of the enclosure 110 into the interior 105 of the enclosure 110 and creates an airflow through the interior 105 of the enclosure 110 that sweeps any process gas, which leaks from the at least one gas vessel 102 or the associated gas distribution components 104, up to the exhaust port 130 where it is exhausted into the exhaust ventilation system 132.

Ambient air is drawn into the enclosure 110 through at least one air intake vent. In the embodiment shown in FIGS. 1-3, ambient air is drawn into the interior of the enclosure 110 through a first air intake vent 126 arranged within a lower portion of the access door 120 and a second air intake vent 128 arranged within an upper portion of the access door 120. Although two air intake vents are provided within the access door 120 in the embodiment shown in FIGS. 1-3, an alternative number of air intake vents may be provided within the access door 120 and/or within one or more sides of the enclosure 110. For example, only one air intake vent (such as, e.g., the first air intake vent 126) may be provided within the access door, in other embodiments. In still other embodiments, more than two air intake vents may be provided. In still other embodiments, substantially the entire access door 120 may be covered with air intake vents.

In some embodiments, additional openings may be provided within the enclosure 110 for drawing ambient air into the interior of the enclosure 110. For example, ambient air may be drawn through the openings 118, which are formed within the front side 111 of the enclosure 110 near the bottom of the enclosure 110. In some embodiments, openings (not shown) may be alternatively or additionally formed within the back side 112, left side 113, right side 114, or bottom side 116 of the enclosure 110 to draw ambient air into the interior of the enclosure 110 near the bottom of the enclosure 110. When the exhaust ventilation system 132 is operated to provide a negative pressure within the interior 105 of the enclosure 110, the ambient air pulled in through the air intake vents 126 and 128, and (optionally) through the additional openings formed near the bottom of the enclosure 110, creates a continuous airflow that sweeps upward through the interior 105 of the enclosure 110 to the exhaust port 130 located near the top of the enclosure 110. Any process gas, which leaks from the gas vessel(s) 102 or the associated gas distribution components 104 contained within the enclosure 110, is swept up by this airflow to the exhaust port 130 where it is exhausted into the exhaust ventilation system 132.

FIG. 3 illustrates the interior 105 of the enclosure 110 as seen through line A-A of FIG. 1. As shown in FIG. 3, a first air plenum 140 and a second air plenum 142 are mounted to a rear surface of the access door 120 directly behind the first air intake vent 126 and the second air intake vent 128, respectively. The air plenums 140/142 mounted to the rear surface of the access door 120 redirect the ambient airflow drawn into the gas cabinet 100 to provide a longer airflow path into the interior 105 of the enclosure 110, as shown and described in more detail below in reference to FIGS. 5A-5C. The interior 105 of the enclosure 110 further includes a third air plenum 117 near the bottom of the enclosure 110 and a fourth air plenum 119 near the top of the enclosure 110. In some embodiments, the third air plenum 117 and/or the fourth air plenum 119 may be provided within the enclosure 110 to reduce or eliminate potential dead zones near the bottom and/or top of the enclosure 110. In some embodiments, the third air plenum 117 may additionally or alternatively provide a mounting surface for supporting the gas vessel(s) 102 within the interior 105 of the enclosure 110.

Figure 4:
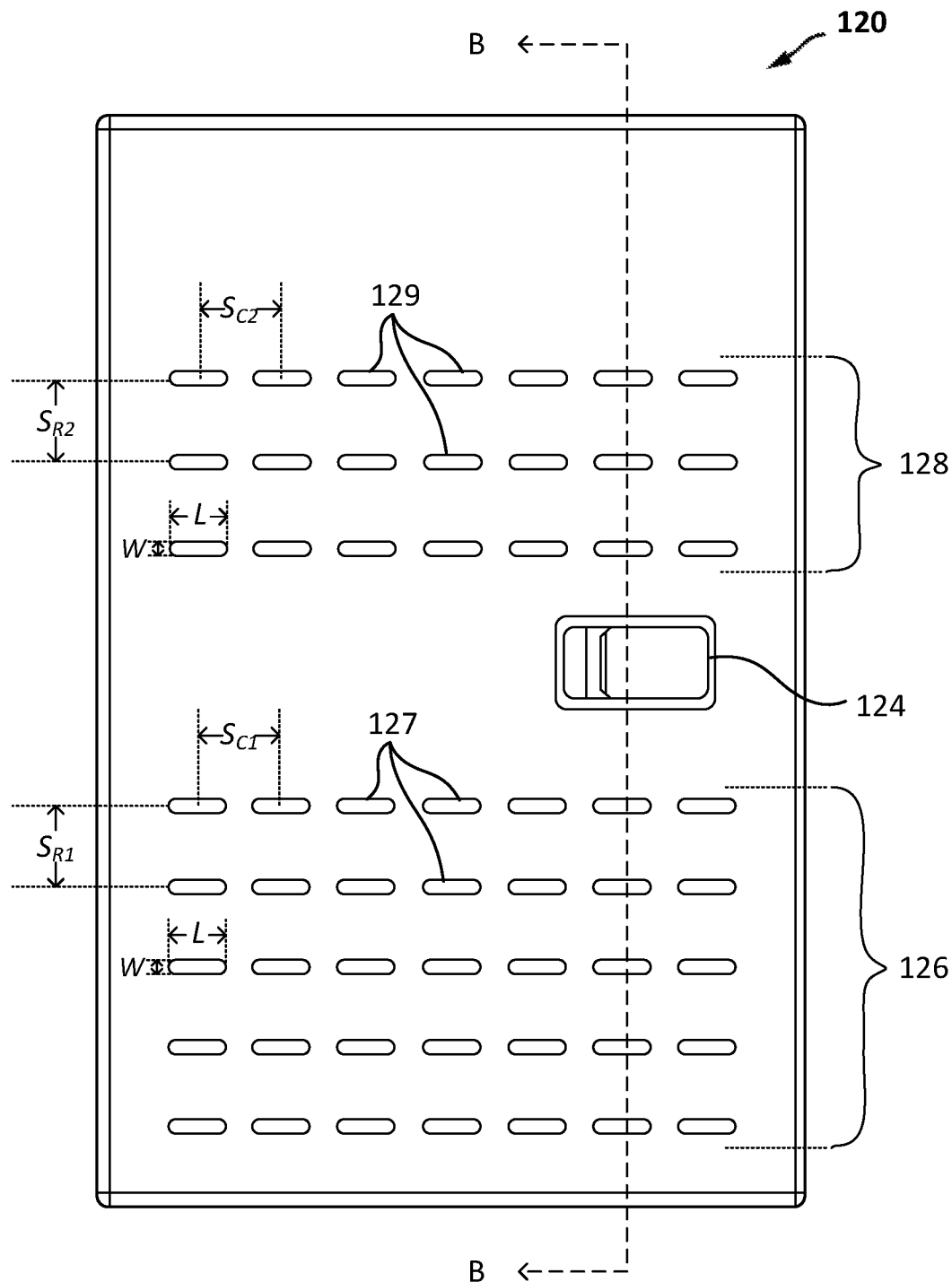
FIG. 4 is a front view of an access door provided on a front side of the gas cabinet shown in FIG. 1.

Further details regarding the access door 120 and the air intake vents 126/128 formed therein are shown in the FIGS. 3, 4 and 5A-C. As shown in FIGS. 3 and 4, the first air intake vent 126 includes a plurality of openings 127 (e.g., 35 openings) arranged in a plurality of rows (e.g., 5 rows) and a plurality of columns (e.g., 7 columns). The second air intake vent 128 also includes a plurality of openings 129 (e.g., 21 openings) arranged in a plurality of rows (e.g., 3 rows) and a plurality of columns (e.g., 7 columns). Although illustrated in the figures as having a particular number of openings arranged in a particular number of rows and columns, the first air intake vent 126 and/or the second air intake vent 128 may include a substantially different number of openings, rows and/or columns than what is explicitly shown in FIG. 4.

The openings 127/129 included within the air intake vents 126/128 may be generally configured (for example, with a particular shape, size and/or spacing between openings) to create a desired airflow velocity into the enclosure 110. As used herein, a desired airflow velocity may be generally defined as an ambient airflow velocity that is sufficient to sweep any process gas, which leaks from the gas vessel(s) 102 or the associated gas distribution components 104 contained within the enclosure 110, up to the exhaust port 130 where it can be exhausted into the exhaust ventilation system 132. In some embodiments, the air intake vents 126/128 (and optionally, the additional openings formed near the bottom of the enclosure 110) may be configured to provide a desired airflow velocity into the enclosure 110 that reduces dead zones within the interior of the enclosure 110. In one example embodiment, the air intake vents 126/128 (and the optional additional openings) may provide a desired airflow velocity into the enclosure 110 that is approximately 50-100 cubic feet per minute (CFM).

In the embodiment shown in FIG. 4, the openings 127/129 formed within the air intake vents 126/128 are illustrated as elongated slots, each having a length (L) that is greater than the width (W) of the slot. For example, the length of the elongated slots may range between ½ inch and 1½ inches, and the width of the elongated slots may range between ⅛ inch and ½ inch. In one example embodiment, the elongated slots forming the openings 127/129 may each have a length (L) of approximately 1 inch and a width (W) of approximately ¼ inch. It will be recognized, however, that the openings 127/129 included within the air intake vents 126/128 are not limited to any particular shape and/or size, and may be alternatively implemented with other shapes and/or sizes suitable to create a desired airflow velocity into the enclosure 110.

As shown in FIG. 4, the plurality of openings 127 within the first air intake vent 126 are arranged in a matrix of rows and columns, such that a row spacing ($S_{R1}$) exists between each of the rows and a column spacing ($S_{C1}$) exists between each of the columns. The plurality of openings 129 within the second air intake vent 128 are similarly arranged in a matrix of rows and columns, such that a row spacing ($S_{R2}$) exists between each of the rows and a column spacing ($S_{C2}$) exists between each of the columns. In some embodiments, the row spacing ($S_{R1}$ and $S_{R2}$) between the plurality of rows and the column spacing ($S_{C1}$ and $S_{C2}$) between the plurality of columns may generally range between 1-2 inches. In the embodiment shown in FIG. 4, the spacings ($S_{R2}$ and $S_{C2}$) between the rows and columns of the plurality of openings 129 provided within the second air intake vent 128 are substantially the same as the spacings ($S_{R1}$ and $S_{C1}$) between the rows and columns of the plurality of openings 127 provided within the first air intake vent 126. For example, the row spacing ($S_{R1}$ and $S_{R2}$) may be approximately equal to 1.38 inches and the column spacing ($S_{C1}$ and $S_{C2}$) may be approximately equal to 1.46 inches. In other embodiments, the spacings ($S_{R2}$ and $S_{C2}$) between the rows and columns of the plurality of openings 129 provided within the second air intake vent 128 may be different than the spacings ($S_{R1}$ and $S_{C1}$) between the rows and columns of the plurality of openings 127 provided within the first air intake vent 126.

Figure 5A:
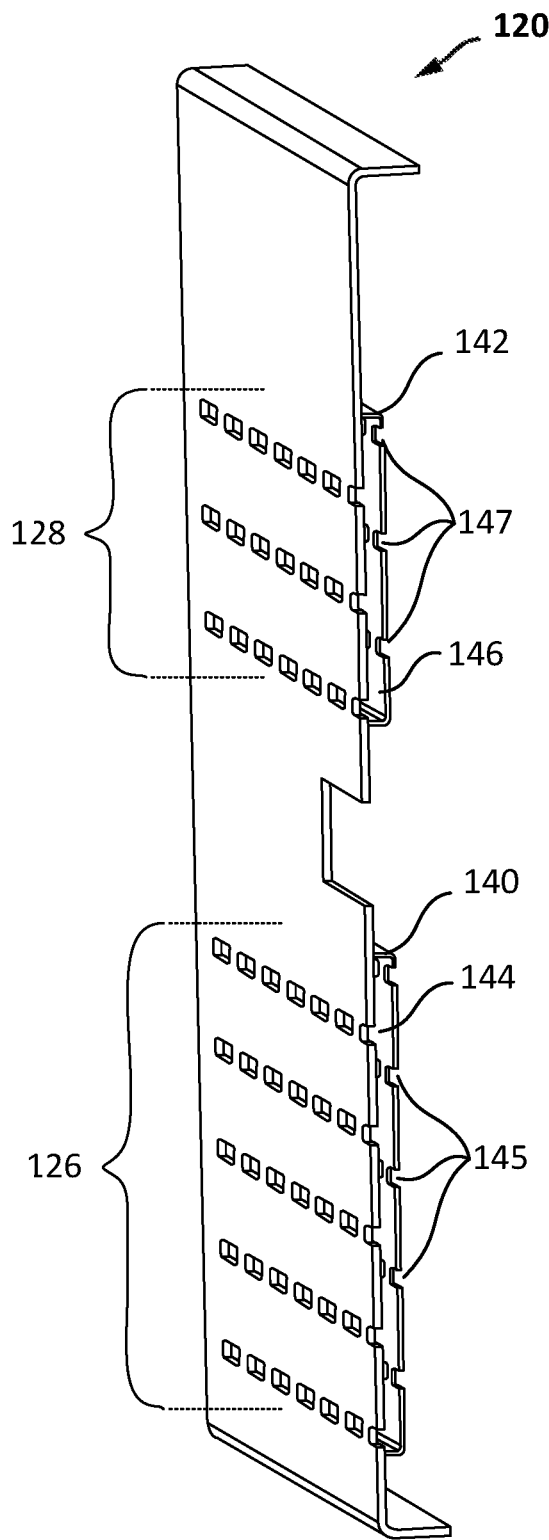
FIG. 5A is a cross-sectional perspective view of the access door taken through line B-B of FIG. 4, illustrating air plenums mounted to a rear surface of the access door.
Figure 5B:
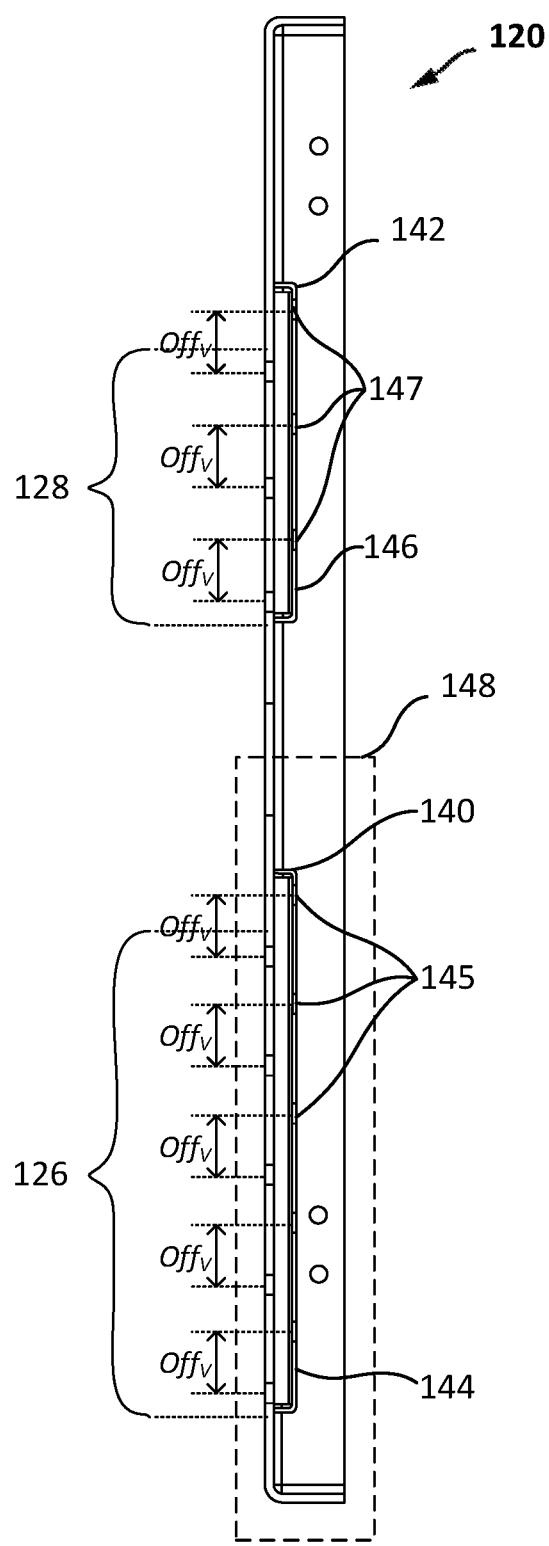
FIG. 5B is a cross-sectional side view of the access door taken through line B-B of FIG. 4, illustrating the air plenums mounted to the rear surface of the access door.

FIGS. 5A and 5B illustrate cross-sectional perspective and side views through the access door 120 taken through line B-B of FIG. 4. As shown in FIGS. 5A and 5B, a first air plenum 140 and a second air plenum 142 are mounted to a rear surface of the access door 120 directly behind the first air intake vent 126 and the second air intake vent 128, respectively. Although two air plenums 140/142 are mounted to the rear surface of the access door 120 in the embodiment shown in FIGS. 5A and 5B, only one air plenum (such as, e.g., the air plenum 140) may be mounted to the rear surface of the access door 120 when only one air intake vent (such as, e.g., the air intake vent 126) is provided.

The air plenums 140/142 mounted behind the air intake vents 126/128 may each include a planar surface 144/146 having a plurality of openings 145/147 formed therein. As shown in FIG. 5B, the plurality of openings 145/147 formed within the air plenums 140/142 are vertically offset from the plurality of openings 127/129 included within the air intake vents 126/128 by an amount ($Off_V$) that ensures the plurality of openings 145/147 within the air plenums 140/142 do not horizontally align with the plurality of openings 127/129 included within the air intake vents 126/128. The offset amount ($Off_V$) is generally less than the row spacing ($S_{R1}$ and $S_{R2}$) provided between the rows of openings 127/129 formed within the air intake vents 126/128. In some embodiments, the offset amount ($Off_V$) may range between ½ inch to 1½ inches, depending on the row spacing ($S_{R1}$ and $S_{R2}$) utilized. In one example embodiment, the offset amount ($Off_V$) may be approximately 0.78 inches when the row spacing is approximately 1.38 inches.

In some embodiments, the openings 145/147 within the air plenums 140/142 may have substantially the same shape, size, spacing and/or number as the openings 127/129 formed within the air intake vents 126/128. In one example embodiment, the air plenum 140 may include a plurality of openings 145 (e.g., 35 openings) arranged in 5 rows and 7 columns, while the air plenum 142 includes a plurality of openings 129 (e.g., 21 openings) arranged in 3 rows and 7 columns. Like the openings 127/129 included within the air intake vents 126/128, the openings 145/147 formed within the air plenums 140/142 may be implemented as elongated slots, each having a length (L) of approximately 1 inch, a width (W) of approximately ¼ inch, a row spacing ($S_R$) of approximately 1.38 inches and a column spacing ($S_C$) of approximately 1.46 inches. It will be recognized, however, that the openings 145/147 are not limited to any particular shape, size, spacing and/or number, and may be alternatively implemented with other shapes, sizes, spacings and/or numbers suitable to create a desired airflow velocity into the enclosure 110. It is further recognized that the shape, size, spacing and/or number of the openings 145/147 formed within the air plenums 140/142 may be different than that of the openings 127/129 formed within the air intake vents 126/128. Regardless of the exact configuration used, the openings 145/147 formed within the air plenums 140/142 are vertically offset from the openings 127/129 formed within the air intake vents 126/128 to redirect the ambient airflow drawn into the gas cabinet 100 and increase the airflow path length from the outside of the enclosure 110 into the interior 105 of the enclosure 110. It will be further recognized that the openings 145/147 formed within the air plenums 140/142 could alternatively be vertically and horizontally offset from the openings 127/129 formed within the air intake vents 126/128.

Figure 5C:
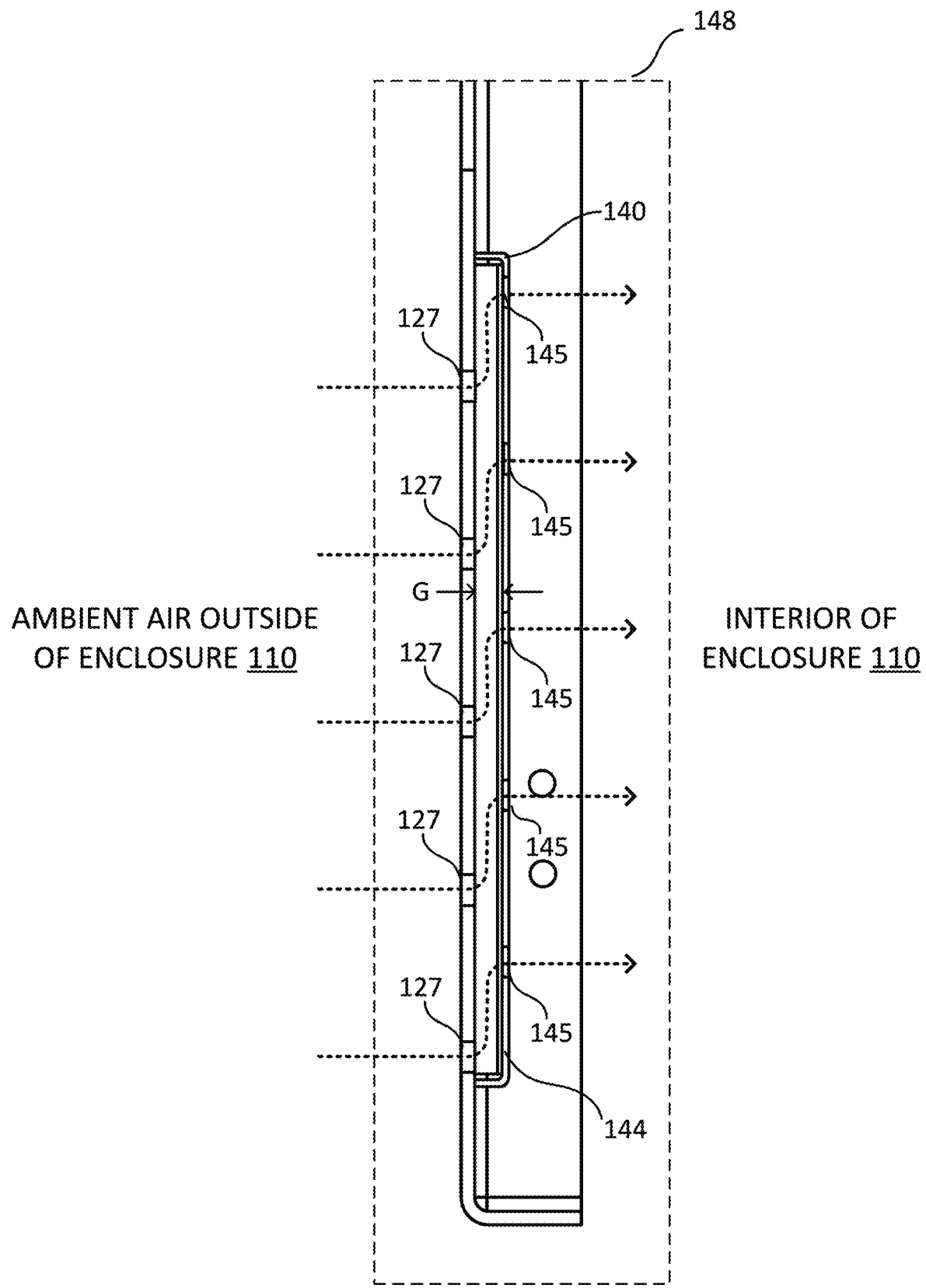
FIG. 5C is a cross-sectional side view through a lower portion of the access door shown in FIG. 5B, illustrating how the air plenums mounted to the rear surface of the access door redirect ambient airflow to provide a longer airflow path into the gas cabinet.

FIG. 5C provides a cross-sectional side view through the lower portion 148 of the access door 120 shown in FIG. 5B, illustrating how the air plenums 140/142 mounted to the rear surface of the access door 120 redirect the ambient airflow drawn into the gas cabinet 100 to provide a longer airflow path into the interior of the enclosure 110. As shown in FIG. 5C, the ambient air from outside of the enclosure 110 is: (a) drawn into the plurality of openings 127 provided within the air intake vent 126, (b) redirected upward through a gap (G) formed between a rear side of the air intake vent 126 and the planar surface 144 of the air plenum 140, and (c) drawn through the plurality of openings 145 provided within the air plenum 140 into the interior of the enclosure 110. Although not shown in FIG. 5C, the ambient air drawn from outside of the enclosure 110 may take a similar path through the plurality of openings 129 formed within the air intake vent 128, the gap (G) formed between a rear side of the air intake vent 128 and the planar surface 146 of the air plenum 142, and the plurality of openings 147 provided within the air plenum 142.

As shown in FIGS. 5A-5C, the gap (G) formed between the rear side of the air intake vents 126/128 and the planar surfaces 144/146 of the air plenums 140/142 is relatively small. For example, the gap (B) may be less than or equal to 1 inch, ½ inch or ¼ inch. In some embodiments, the gap (G) may be less than or equal to a dimension (e.g., a length or width) of the openings 127/129 formed within the air intake vents 126/128 and/or the openings 145/147 formed within the air plenums 140/142. In one example, the gap (G) may be substantially equal to the width (e.g., ¼ inch) of the openings 127/129 formed within the air intake vents 126/128, so as to substantially maintain the desired airflow velocity into the enclosure 110.

By redirecting the ambient airflow drawn into the air intake vents 126/128 upward through the gap (G), the air plenums 140/142 provide a longer ambient airflow path from the outside of the enclosure 110 into the interior of the enclosure 110 compared to the ambient airflow path (i.e., the sheet metal thickness used to form the access door 120) that would have been provided without the air plenums 140/142. In some embodiments, for example, the air plenums 140/142 may provide an ambient airflow path that is 10 to 15 times longer than the ambient airflow path that would have been provided without the air plenums 140/142.

The longer airflow path provided by the air plenums 140/142 reduces (or substantially prevents) the diffusion of process gas outside of the enclosure 110 by significantly decreasing the probability that a gas molecule could remain near the inner surfaces of the air intake vents 126/128 (in the low velocity flow field provided along the inner surfaces) for the entire airflow path length. Once the gas molecule enters the higher velocity stream near the middle of the gap (G), it will be carried back into the enclosure 110 by the ambient air drawn into the air intake vents 126/128. In some cases, the longer airflow path provided by the air plenums 140/142 may enable the exhaust flow rate provided by the exhaust ventilation system 132 to be reduced, thereby reducing loading on the exhaust ventilation system 132 and reducing the amount of energy consumed by the blowers.

Toxicity tests were conducted with tracer gas to measure the chemical concentration of tracer gas that diffuses outside of the gas cabinet 100, and the test results were compared against those obtained from conventional gas cabinets. In one such test, a perfluorodimethylcyclobutane (PDCB) tracer gas secured within the gas cabinet 100 was configured to release PDCB tracer gas into the interior of the enclosure 110 at a tracer gas concentration of 0.35% and tracer gas flow rate of 0.8 liters per minute (lpm), resulting in a chemical release rate of 0.35%×0.8 lpm=0.0028 lpm. During the toxicity test performed on the gas cabinet 100, the concentration of the PDCB tracer gas detected outside of the enclosure 110 was 0.084 parts per million (ppm), which requires an exhaust flow rate of approximately 60 cubic feet per minute (cfm) to pass. In comparison, a similar toxicity test performed on a conventional gas cabinet required a substantially higher exhaust flow rate (e.g., greater than 100 cfm) to pass. As such, the toxicity test results show that the air plenums 140/142 included within the gas cabinet 100 can be used to decrease gas diffusion outside of the enclosure 110 and enable the exhaust flow rate to be reduced (e.g., by about 40% or more). The reduction in exhaust flow rate provided by the gas cabinet 100 reduces loading on the exhaust ventilation system 132 and the amount of energy consumed by the blowers.

An example embodiment of a gas cabinet 100 with reduced gas diffusion outside of the enclosure 110 and reduced exhaust flow rate is illustrated in FIGS. 1-5 and described above. The gas cabinet 100 improves upon conventional gas cabinets and gas containment methods, in at least one respect, by providing a longer ambient airflow path from the outside of the enclosure 110 into the interior 105 of the enclosure 110. The gas cabinet 100 provides a longer ambient airflow path by mounting an air plenum directly behind the air intake vent as shown, for example, in FIGS. 5A-5C. When ambient air is drawn from outside of the enclosure 110 into the interior 105 of the enclosure 110, the ambient air is redirected through the air plenum to increase the airflow path length into the enclosure 110, which in turn, reduces the diffusion of process gas outside of the enclosure 110 and enables the exhaust flow rate to be reduced. Unlike some conventional designs, which may include air intake vents having adjustable louvers, the longer airflow path provided by the air plenums 140/142 is fixed and not adjustable.

Figure 6:
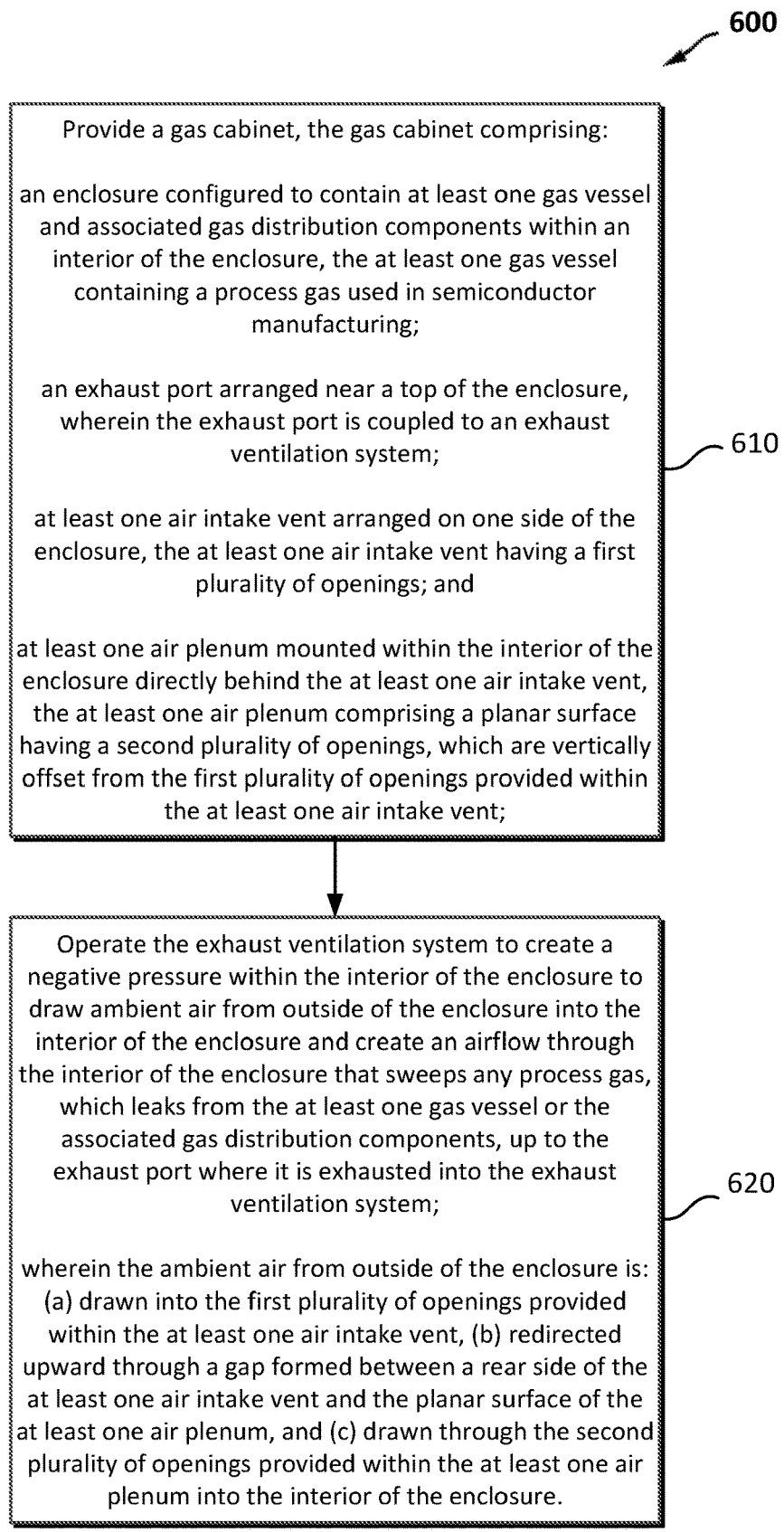
FIG. 6 is a flowchart diagram illustrating one embodiment of a method in accordance with the present disclosure.

FIG. 6 illustrates one embodiment of a method 600 that utilizes the techniques disclosed herein to reduce the diffusion of process gas outside of a gas cabinet (or exhausted enclosure). It will be recognized that the embodiment of the method 600 shown in FIG. 6 is merely exemplary and additional methods may utilize the techniques described herein. Further, additional processing steps may be added to the method 600 shown in FIG. 6 as the steps described are not intended to be exclusive. Moreover, the order of the steps is not limited to the order shown in the figure as different orders may occur and/or various steps may be performed in combination or at the same time.

The method 600 shown in FIG. 6 includes providing a gas cabinet comprising an enclosure, an exhaust port, at least one air intake vent and at least one air plenum (in step 610). The enclosure is configured to contain at least one gas vessel and associated gas distribution components within an interior of the enclosure. In some embodiments, the at least one gas vessel may contain a process gas used in semiconductor manufacturing. The exhaust port is arranged near a top of the enclosure and coupled to an exhaust ventilation system. The at least one air intake vent, which is arranged on at least one side of the enclosure, has a first plurality of openings. The at least one air plenum is mounted within the interior of the enclosure directly behind the at least one air intake vent. The at least one air plenum comprises a planar surface having a second plurality of openings, which are vertically offset from the first plurality of openings provided within the at least one air intake vent. In some embodiments, the gas cabinet provided in step 610 may be the same, or at least similar to, the gas cabinet 100 shown in FIGS. 1-5.

The method 600 further includes operating the exhaust ventilation system to create a negative pressure within the interior of the enclosure to draw ambient air from outside of the enclosure into the interior of the enclosure and create an airflow through the interior of the enclosure that sweeps any process gas, which leaks from the at least one gas vessel or the associated gas distribution components, up to the exhaust port where it is exhausted into the exhaust ventilation system (in step 620).

When the air plenum is included within the gas cabinet, the ambient air from outside of the enclosure is: (a) drawn into the first plurality of openings provided within the at least one air intake vent, (b) redirected upward through a gap formed between a rear side of the at least one air intake vent and the planar surface of the at least one air plenum, and (c) drawn through the second plurality of openings provided within the at least one air plenum into the interior of the enclosure. By redirecting the ambient air through the gap, the air plenum provides a longer airflow path from the outside of the enclosure into the interior of the enclosure. As noted above, the longer airflow path reduces a diffusion of process gas outside of the enclosure. In some embodiments, the method 600 may further include reducing an exhaust flow rate of the exhaust ventilation system in response to the diffusion of the process gas outside of the enclosure.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the gas cabinets and methods described herein will be apparent to those skilled in the art in view of this description. It will be recognized, therefore, that the described gas cabinets and methods are not limited by the example arrangements. It is to be understood that the forms of the gas cabinets and methods shown and described herein are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A gas cabinet, comprising:
an enclosure configured to contain at least one gas vessel and associated gas distribution components within an interior of the enclosure, wherein the at least one gas vessel contains a process gas used in semiconductor manufacturing;
an exhaust port arranged near a top of the enclosure, wherein an exhaust ventilation system is coupled to the exhaust port to create a negative pressure within the interior of the enclosure;
an air intake vent having a first plurality of openings, wherein the negative pressure created by the exhaust ventilation system draws ambient air from outside of the enclosure into the interior of the enclosure through the first plurality of openings provided within the air intake vent to create an airflow through the interior of the enclosure that sweeps any process gas, which leaks from the at least one gas vessel or the associated gas distribution components, up to the exhaust port where it is exhausted into the exhaust ventilation system at an exhaust flow rate; and
an air plenum mounted within the interior of the enclosure directly behind the air intake vent, wherein the air plenum provides a longer airflow path from the outside of the enclosure into the interior of the enclosure, wherein the longer airflow path provided by the air plenum is fixed and not adjustable, and wherein the longer airflow path reduces a diffusion of the any process gas outside of the enclosure and/or enables the exhaust flow rate of the exhaust ventilation system to be reduced.

2. The gas cabinet of claim 1, wherein the air plenum comprises a planar surface having a second plurality of openings formed therein, wherein the second plurality of openings are vertically offset from the first plurality of openings provided within the air intake vent to provide the longer airflow path from the outside of the enclosure into the interior of the enclosure.

3. The gas cabinet of claim 2, wherein the second plurality of openings are vertically offset from the first plurality of openings by an amount that ensures openings within the second plurality of openings do not horizontally align with openings within the first plurality of openings.

4. The gas cabinet of claim 2, wherein the first plurality of openings and the second plurality of openings are each arranged in a plurality of rows and a plurality of columns, wherein a spacing exists between each of the plurality of rows, and wherein the second plurality of openings are vertically offset from the first plurality of openings by an amount, which is less than the spacing between each of the plurality of rows.

5. The gas cabinet of claim 2, wherein a number and/or size of openings within the second plurality of openings is substantially equal to a number and/or size of openings within the first plurality of openings.

6. The gas cabinet of claim 2, wherein a number and/or size of openings within the second plurality of openings is different from a number and/or size of openings within the first plurality of openings.

7. The gas cabinet of claim 2, wherein the ambient air from outside of the enclosure is: (a) drawn into the first plurality of openings, (b) redirected upward through a gap formed between a rear side of the air intake vent and the planar surface of the air plenum, and (c) drawn through the second plurality of openings into the interior of the enclosure.

8. The gas cabinet of claim 7, wherein a width of the gap is less than or equal to one inch.

9. The gas cabinet of claim 7, wherein a width of the gap is less than or equal to a length or a width of the openings within the first plurality of openings.

10. The gas cabinet of claim 2, wherein the enclosure comprises a plurality of sides forming an elongated box, and wherein the plurality of sides includes a front side, a back side, a left side, a right side, a top side and a bottom side.

11. The gas cabinet of claim 10, further comprising an access door coupled to the front side of the enclosure to provide access to the interior of the enclosure, wherein the air intake vent is provided within the access door, and wherein the air plenum is mounted to a rear surface of the access door directly behind the air intake vent.

12. The gas cabinet of claim 11, further comprising:
an additional air intake vent having a third plurality of openings, wherein the negative pressure created by the exhaust ventilation system draws the ambient air from outside of the enclosure through the third plurality of openings provided within the additional air intake vent; and
an additional air plenum mounted within the interior of the enclosure directly behind the additional air intake vent, wherein the additional air plenum comprises a planar surface having a fourth plurality of openings formed therein, wherein the fourth plurality of openings are vertically offset from the third plurality of openings provided within the additional air intake vent to provide a longer airflow path from the outside of the enclosure into the interior of the enclosure.

13. The gas cabinet of claim 12, wherein the air intake vent is provided within a lower portion of the access door and the air plenum is mounted to the rear surface of the lower portion of the access door directly behind the air intake vent, and wherein the additional air intake vent is provided within an upper portion of the access door and the additional air plenum is mounted to the rear surface of the upper portion of the access door directly behind the additional air intake vent.

14. A gas cabinet, comprising:
an enclosure configured to contain at least one gas vessel and associated gas distribution components within an interior of the enclosure, the at least one gas vessel containing a process gas used in semiconductor manufacturing;
an exhaust port arranged near a top of the enclosure, wherein an exhaust ventilation system is coupled to the exhaust port to create a negative pressure within the interior of the enclosure, wherein the negative pressure draws ambient air from outside of the enclosure into the interior of the enclosure and creates an airflow through the interior of the enclosure that sweeps any process gas, which leaks from the at least one gas vessel or the associated gas distribution components, up to the exhaust port where it is exhausted into the exhaust ventilation system;
an air intake vent arranged on one side of the enclosure, the air intake vent having a first plurality of openings; and
an air plenum mounted within the interior of the enclosure directly behind the air intake vent, wherein the air plenum comprises a planar surface having a second plurality of openings that are vertically offset from the first plurality of openings provided within the air intake vent, wherein the second plurality of openings are vertically offset from the first plurality of openings by an amount that ensures openings within the second plurality of openings do not align with any portion of the openings within the first plurality of openings;

wherein the ambient air from outside of the enclosure is: (a) drawn into the first plurality of openings provided within the air intake vent, (b) redirected upward through a gap formed between a rear side of the air intake vent and the planar surface of the air plenum, and (c) drawn through the second plurality of openings provided within the air plenum into the interior of the enclosure.

15. The gas cabinet of claim 14, wherein the air plenum provides a longer airflow path from the outside of the enclosure into the interior of the enclosure by redirecting the ambient air through the gap, and wherein the longer airflow path reduces a diffusion of the any process gas outside of the enclosure.

16. The gas cabinet of claim 14, further comprising an access door coupled to a front side of the enclosure to provide access to the interior of the enclosure, wherein the air intake vent is provided within the access door, and wherein the air plenum is mounted to a rear surface of the access door directly behind the air intake vent.

17. The gas cabinet of claim 15, wherein the longer airflow path provided by the air plenum is fixed and not adjustable.

* * * * *